United States Patent

[11] 3,617,935

[72] Inventors Katuhiro Kimura
Tokyo;
Yoichi Kaneko, Kokubunji-shi; Masao Kamimura, Kokubunji-shi, all of Japan

[21] Appl. No. 866,236
[22] Filed Oct. 14, 1969
[45] Patented Nov. 2, 1971
[73] Assignee Hitachi, Ltd.
Tokyo, Japan
[32] Priority Oct. 18, 1968
[33] Japan
[31] 43/75618

[54] SOLID-STATE OSCILLATOR
9 Claims, 6 Drawing Figs.

[52] U.S. Cl. ........................................................ 331/107 R, 331/96, 331/107 G, 331/107 T, 331/176, 333/98
[51] Int. Cl. ........................................................ H03b 7/06
[50] Field of Search ........................................................ 331/117, 107 G, 107 T, 176, 96

[56] References Cited
UNITED STATES PATENTS

| | | | |
|---|---|---|---|
| 3,199,050 | 8/1965 | Schleenbecker ............ | 331/176 |
| 3,343,103 | 9/1965 | Schoniger.................... | 331/117 |
| 3,487,334 | 12/1969 | Eastman et al. ............. | 331/107 |
| 3,509,567 | 4/1970 | Bulman ........................ | 331/107 |
| 3,516,018 | 6/1970 | Yu................................ | 331/107 |

*Primary Examiner*—John Kominski
*Attorney*—Craig, Antonelli and Hill

ABSTRACT: A high-power solid-state oscillator comprising a cavity resonator, a conductive plate positioned in said cavity resonator and in a plane perpendicular to the electric field in said cavity resonator and bisecting said cavity resonator, and at least two solid-state oscillating elements symmetrically positioned respectively on opposite surfaces of said conductive plate and positioned in a plane perpendicular to the axis of said cavity resonator.

PATENTED NOV 2 1971 3,617,935

INVENTORS

Figures 1A, 1B, 2A, 2B, 3A, 3B:
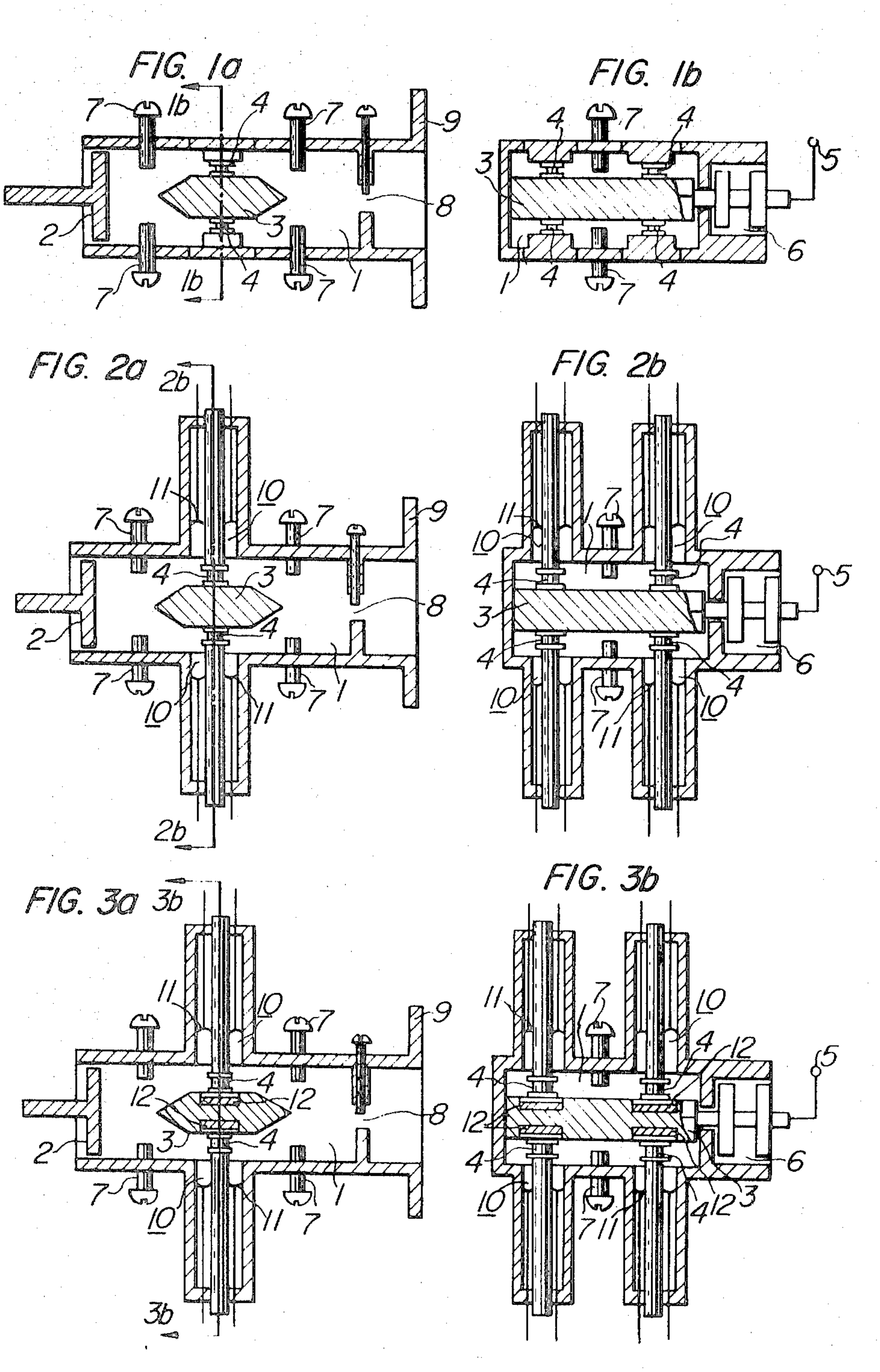

KATUHIKO KIMURA, YOICHI KANEKO and MASAO KAMIMURA

BY

Craig, Antonelli, Stewart & Hill

ATTORNEYS

SOLID-STATE OSCILLATOR

The present invention relates to a solid-state oscillator, and more particularly to a high-power solid-state oscillator comprising a cavity resonator equipped with a plurality of solid-state oscillating elements therein.

When a solid-state oscillating element is used as a power source on millimeter wave and microwave bands, only a power less than that of an electron tube such as a magnetron or klystron can be obtained therefrom. This is because the crystal element itself can only receive a limited input power. An increase in the output power is possible by constructing the oscillator in such a way that the Joule's heat produced in the element can be sufficiently dissipated to increase the input power to a certain extent. However, it is nearly impossible to increase the limit of the input power of the crystal element itself to a great extent because the size of the element is restricted by its character as a solid-state oscillating element. It is also conceivable to reduce the thickness of the crystal element as much as possible so that the produced heat is effectively dissipated. However, since the thickness of the crystal element is restricted by the oscillation frequency and the like, it cannot be reduced for the purpose of heat dissipation. As methods of improving the output of the oscillator outside of the crystal element itself, the Q-factor of a resonator within which the element is placed may be made high, and the loss of the circuit thereof may be reduced by adjusting the coupling part of a load. However, improvements resulting from these methods are only successful to a limited degree.

As stated above, it is very difficult to provide a high output by utilizing a single solid-state oscillating element. Therefore, it has been proposed to provide a high output by placing a plurality of solid-state oscillating elements in a cavity resonator. In fact, however, there has been no arrangement which is efficient and provides stable operation.

It is an object of the present invention to provide a solid-state oscillator which is small in size and yet which is provided with a number of solid-state oscillating elements in its cavity resonator.

It is another object of the present invention to provide a solid-state oscillator capable of providing a stable operation even when the frequency varies It is still another object of the present invention to provide a solid-state oscillator capable of regulating a high frequency voltage operating a plurality of solid-state oscillating elements.

According to the present invention there is provided a solid-state oscillator comprising a cavity resonator having an output part, a conductive plate isolatedly attached to said cavity resonator in a plane perpendicular to the direction of an electric field in said resonator at a position bisecting said resonator, at least two solid-state oscillating elements disposed respectively on opposite surfaces of said conductive plate and substantially in a plane perpendicular to the axis of said resonator, and means for applying a bias voltage to said elements through said conductive plate.

The construction, features and advantages of the present invention will become more apparent from the following detailed description of the invention taken in conjunction with the accompanying drawings, in which:

FIGS. 1*a*, 2*a* and 3*a* are cross-sectional views of embodiments of the invention; and FIGS. 1*b*, 2*b* and 3*b* are cross-sectional views taken along the lines 1*b*—1*b*, 2*b*—2*b* and 3*b*—3*b* of the embodiments of FIGS. 1*a*, 2*a* and 3*a*, respectively.

In FIGS. 1*a* and 1*b*, reference numeral 1 designates a cavity resonator constituted by a part of a rectangular waveguide, 2 designates a movable short-circuiting plate for frequency adjustment, 3 designates a conductive plate provided at a position bisecting the resonator in a plane perpendicular to the direction of an electric field in the cavity resonator, 4 designates a plurality of solid-state oscillating elements arranged on opposite surfaces of the conductive plate 3 and in a plane perpendicular to the axis of the wave guide, 5 designates a terminal for applying a DC bias voltage to the solid state oscillating elements, 6 designates an RF choke for preventing an RF energy from leaking while applying a DC bias voltage to the solid state oscillating elements, 7 designates stub adjusting parts, 8 designates a coupling window, and 9 designates a flange for connection with an outer circuit. As the solid state oscillating element 4, a gunn diode, IMPATT (impact avalanche and transit time) diode, or LSA (limited space charge accumulation) diode may be utilized in the present invention.

The plurality of solid state oscillating elements 4 (four elements in this embodiment) are arranged symmetrically with respect to the conductive plate 3 so that the oscillation mode of the cavity resonator 1 is excited in a $TE_{10}$ mode. By this arrangement the oscillating elements 4 are positioned in an equiphase plane of a standing wave generated in the resonator 1. Consequently, a stabilized oscillation output can be obtained because the ratio of the RF voltages applied to the plural oscillating elements 4 is always constant even if the frequency varies. The plural oscillating elements 4 are connected with a common electrode, i.e. the conductive plate 3 which applies a DC bias voltage to the oscillating elements 4 passing through the RF choke 6. The conductive plate 3 is isolated DC-wise from the wall of the resonator 1, and tapered in its ends in the direction of the axis of the waveguide considering the circuit matching. Since the conductive plate 3 serves as a common electrode to the oscillating elements, a DC bias voltage need be applied to the elements 4 through only one RF choke which is complicated in structure. Therefore, the structure of the solid state oscillator becomes very simple. The movable short-circuiting plate 2 and the stub adjusting parts 7 are used for adjusting the impedance of each oscillating element and the frequency. In order to efficiently derive the oscillation output from an oscillating element it is necessary for the load of a circuit seen from the oscillating element to take substantially a constant value without much varying with the variation in the frequency. This is effected by the selection of the position of the short-circuiting plate 2 and the adjustment of the stub adjusting parts 7. Incidentally, since the operation of the solid-state oscillator is well known, the description thereof is omitted here.

In FIGS. 2*a* and 2*b*, which show another embodiment of the present invention, reference numerals 1 to 9 designate similar parts to those in FIGS. 1*a* and 1*b*, 10 designates variable reactance circuits, and 11 designates short plungers. In the embodiment of FIGS. 1*a* and 1*b*, the ratio of the RF voltages applied to the respective elements 4 cannot be varied after the oscillator is assembled. Consequently, when there is unevenness of the characteristics of the oscillating elements, the adjustment thereof is very difficult. However, if the variable reactance circuit 10 is connected in series with the oscillating element 4 as in the embodiment of FIGS. 2*a* and 2*b*, the reactance connected with the oscillating element 4 can be varied by varying the position of the short plunger 11. Thus, since the value of the RF voltage acting upon the oscillating element can be varied as desired, the ratio of the RF voltages acting upon the plural oscillating elements can be varied as required. As a result, the adjustment of the oscillation output becomes easy.

In FIGS. 3*a* and 3*b*, which show a further embodiment of the present invention, reference numerals 1 to 11 designate similar parts to those in FIGS. 2*a* and 2*b*, and 12 designates resistive elements connected in series with the solid-state oscillating elements 4.

Since the conductive plate 3 is used in the above embodiments as a common electrode for supplying a DC bias voltage to a plurality of solid state oscillating elements 4, when one of the oscillating elements is damaged and short-circuited, the DC bias voltage is not applied to the other undamaged oscillating elements. Thus, the solid-state oscillator becomes unusable due to the damage of one oscillating element. The embodiment of FIGS. 3*a* and 3*b* obviates this shortcoming by connecting the resistive elements 12 in series with the oscillating elements 4 so that the DC bias voltage can be applied to the oscillating elements 4 even when some of the oscillating elements are damaged and short-circuited. Furthermore, the resistive element 12 prevents the oscillating element from damaging due to an overcurrent. In particular, if a variable resistive element, the resistance of which increases with elevation of temperature, such as a posistor (trade mark), is used, a solid state oscillator of a stabilized operation can be provided since a substantially constant current can always be supplied even if the temperature of the oscillator is elevated. Although essentially the resistor element 12 may be connected in series with the oscillating element 4, it must be positioned at a portion (for example, it is embedded in the conductive plate 3 in the embodiment of FIGS. 3*a* and 3*b*) which is not affected RF-wise in order to prevent lowering the output due to an RF loss.

In all of the above-described embodiments a plurality of solid-state oscillating elements are arranged in an equiphase plane in an electromagnetic field, i.e. in a plane perpendicular to the axial direction of resonator. However, deviation of relative positions between the oscillating elements in the axial direction of the resonator is permissible to an extent that the ratio of the RF voltage acting on the oscillating elements does not largely vary with a variation in the frequency. That is, if the maximum distance between deviated elements in the axial direction of the resonator is ⅛ λg. or less, where λg. is the wavelength in the waveguide, i.e. 45 ° or less in terms of a so-called phase difference, such degree of deviation is not objectionable. However, the smaller the distance of deviation, the more effective will be the operation, of course.

In the above-described embodiments a part of a rectangular waveguide was utilized as a cavity resonator. However, it is to be noted that other shapes of wave guides such as circular or elliptic ones likewise be used.

What is claimed is:

1. A solid-state oscillator comprising a cavity resonator having an output part, a conductive plate isolatedly attached at one end to a wall of said cavity resonator and extending with a free end to a point adjacent an opposite wall of said cavity resonator in an equiphase plane perpendicular to the direction of an electric field in said resonator at a position bisecting said resonator, at least two solid-state oscillating elements disposed respectively on opposite surfaces of said conductive plate and substantially in a plane perpendicular to the axis of said resonator between said conductive plate and the resonator so as to be connected in parallel to one another, and means for applying a bias voltage to said elements through said conductive plate at said free end thereof.

2. A solid-state oscillator according to claim 1, wherein the positional deviation of said solid-state oscillating elements in the axial direction is such that the maximum axial distance between said solid state oscillating elements if from 0 to ⅛ λg. where λg. is the guide wavelength.

3. A solid-state oscillator according to claim 1, wherein at least one of said solid-state oscillating elements is provided with a variable reactance circuit connected in series therewith, thereby making an RF voltage acting on said solid-state oscillating element variable.

4. A solid-state oscillator according to claim 1, wherein each of said solid-state oscillating elements is provided with a resistive element connected in series therewith, and a DC bias voltage is applied to each series circuit consisting of at least said solid-state oscillating element and said resistive element.

5. A solid-state oscillator according to claim 4, wherein said resistive element is embedded in said conductive plate.

6. A solid-state oscillator according to claim 4, wherein said resistive element is a variable resistive element the resistance of which varies with temperature.

7. A solid-state oscillator according to claim 1, wherein said conductive plate has sides which are tapered in the direction of the axis of said resonator.

8. A solid-state oscillator according to claim 1, wherein a plurality of adjustable tuning members are provided at locations in said cavity resonator with respect to said conductive plate to effectively tune the respective oscillating elements independently.

9. A solid-state oscillator according to claim 8, wherein said conductive plate has sides which are tapered in the direction of the axis of said resonator.

* * * * *